US008081150B2

(12) United States Patent
An

(10) Patent No.: US 8,081,150 B2
(45) Date of Patent: *Dec. 20, 2011

(54) OUTPUT BUFFER OF A SOURCE DRIVER IN A LIQUID CRYSTAL DISPLAY HAVING A HIGH SLEW RATE AND A METHOD OF CONTROLLING THE OUTPUT BUFFER

(75) Inventor: Chang-Ho An, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/947,869

(22) Filed: Nov. 17, 2010

(65) Prior Publication Data

US 2011/0063200 A1 Mar. 17, 2011

Related U.S. Application Data

(62) Division of application No. 11/294,080, filed on Dec. 5, 2005, now Pat. No. 7,859,505.

(30) Foreign Application Priority Data

Dec. 9, 2004 (KR) ........................ 10-2004-0103629

(51) Int. Cl.
*G09G 3/36* (2006.01)
*H03F 1/14* (2006.01)
*H03F 3/45* (2006.01)

(52) U.S. Cl. .......... 345/98; 330/292; 330/257; 330/260; 345/99

(58) Field of Classification Search ............ 345/87–104; 330/225, 257
See application file for complete search history.

(56) References Cited

U.S. PATENT DOCUMENTS

| | | | | |
|---|---|---|---|---|
| 5,457,421 | A * | 10/1995 | Tanabe | 327/530 |
| 5,917,378 | A * | 6/1999 | Juang | 330/253 |
| 6,496,175 | B1 * | 12/2002 | Fukuo | 345/99 |
| 7,652,538 | B2 * | 1/2010 | Choi | 330/292 |
| 2005/0093629 | A1 * | 5/2005 | Nishimura et al. | 330/253 |
| 2006/0091955 | A1 * | 5/2006 | Choi | 330/260 |

* cited by examiner

*Primary Examiner* — Amr Awad
*Assistant Examiner* — Kenneth Bukowski
(74) *Attorney, Agent, or Firm* — F. Chau & Associates, LLC

(57) ABSTRACT

Provided is an output buffer for a source driver of an LCD with a high slew rate, and a method of controlling the output buffer. The output buffer, which outputs a source line driving signal for driving a source line of the LCD, includes: an amplifier section amplifying an analog image signal; an output section outputting the source line driving signal in response to a signal amplified by the amplifier section; and a slew rate controller section, setting a capacitance of a capacitor section to a first capacitance, during a first charge sharing period in which the source line is precharged to a first precharge voltage, setting the capacitance of the capacitor section to a second capacitance smaller than the first capacitance during a second charge sharing period in which the source line driving signal is supplied to the source line, and setting the capacitance of the capacitor section to the first capacitance while the source line driving signal is maintained after the second charge sharing period.

9 Claims, 7 Drawing Sheets

FIG. 6

| VDD [V] | SETTLING TIME | | | | | | | | IDD | | | |
|---|---|---|---|---|---|---|---|---|---|---|---|---|
| | CONVENTIONAL BUFFER | | | | BUFFER OF THE PRESENT INVENTION | | | | CONVENTIONAL BUFFER | | BUFFER OF THE PRESENT INVENTION | |
| | Tr | | Tf | | Tr | | Tf | | OPERATION CURRENT | | | |
| | RISING PERIOD [μs] | | FALLING PERIOD [μs] | | RISING PERIOD [μs] | | FALLING PERIOD [μs] | | μA | mA | μA | mA |
| | Tr1 | Tr2 | Tf1 | Tf2 | Tr1 | Tr2 | Tf1 | Tf2 | 1 CHANNEL | 1 CHANNEL | 1 CHANNEL | 384 CHANNEL |
| 13.5 | 1.486 | 8.385 | 1.305 | 9.130 | 0.899 | 8.059 | 0.813 | 8.021 | 61.64 | 23.67 | 61.19 | 23.49 |

OUTPUT BUFFER OF A SOURCE DRIVER IN A LIQUID CRYSTAL DISPLAY HAVING A HIGH SLEW RATE AND A METHOD OF CONTROLLING THE OUTPUT BUFFER

CROSS-REFERENCE TO RELATED PATENT APPLICATIONS

This application is a Divisional of U.S. application Ser. No. 11/294,080 filed on Dec. 5, 2005, now U.S. Pat. No. 7,859, 505 which claims priority to Korean Patent Application No. 10-2004-0103629, filed on Dec. 9, 2004, in the Korean Intellectual Property Office, the disclosures of which are incorporated by reference herein in their entireties.

BACKGROUND OF THE INVENTION

1. Technical Field

The present invention relates to a Liquid Crystal Display (LCD), and more particularly, to an output buffer of a source driver included in an LCD having a high slew rate and a method of controlling the output buffer.

2. Discussion of the Related Art

An LCD is one of the most widely used flat panel displays because of its small-size, thinness and low power consumption. For example, an LCD is commonly found in a variety of electronic devices such as flat screen televisions, notebook computers, cell phones and digital cameras.

There are two main types of LCDs used in the market; they are passive matrix and active matrix. Because active matrix type LCDs use thin-film transistors as their switching devices, which enable products to be developed that have very good image quality, wide color gamut, and response time, they are increasingly becoming the choice of notebook computer and flat screen television manufacturers.

FIG. 1 is a block diagram illustrating a conventional active matrix type LCD 100. Referring to FIG. 1, the LCD 100 includes a liquid crystal panel 110, source drivers SD for driving a plurality of source lines SL, and gate drivers GD for driving a plurality of gate lines GL. It is noted that the source lines SL may also be referred to as data lines or channels.

The liquid crystal panel 110 includes a plurality of pixels 111. Each of the pixels 111 includes a switch transistor TR, a storage capacitor CST for reducing current leakage from a liquid crystal, and a liquid crystal capacitor CLC.

As shown in FIG. 1, the switch transistor TR is turned on/off in response to a signal received at a first terminal of the switch transistor TR for driving a gate line GL. A second terminal of the switch transistor TR is connected to a source line SL. The storage capacitor CST is connected between a third terminal of the switch transistor TR and a ground voltage VSS. The liquid capacitor CLC is connected between the third terminal of the switch transistor TR and a common voltage VCOM. Here, the common voltage VCOM may be half the value of a power supply voltage VDD.

FIG. 2 is a circuit diagram of a source driver (SD) 200 illustrated in FIG. 1. Referring to FIG. 2, the source driver 200 includes a digital-to-analog converter (DAC) 210, output buffers 220, output switches 230, and charge sharing switches 240.

The DAC 210 receives and converts a digital image signal D_DAT into analog image signals A_DAT1, A_DAT2, . . . , A_DATn. Each of the analog image signals A_DAT1, A_DAT2, . . . , A_DATn has a gray level voltage.

Each of the output buffers 220 amplifies a corresponding analog image signal A_DAT1, A_DAT2, . . . , A_DATn and outputs the amplified analog image signal to a corresponding output switch 230. The output switch 230 outputs the amplified analog image signal as one of a plurality of source line driving signals Y1, Y2, . . . , Yn in response to the activation of output switch control signals OSW and /OSW. Each of the source line driving signals Y1, Y2, . . . , Yn is supplied to a load LD connected to a source line SL.

As shown in FIG. 2, one of the loads LD is modeled by parasitic resistors RL1 through RL5 and parasitic capacitors CL1 through CL5, interconnected in the form of a ladder circuit.

Referring still to FIG. 2, the charge sharing switches 240 share charges stored in loads LD connected to the source lines SL in response to the activation of sharing switch control signals CSW and /CSW, thus precharging the source line driving signals Y1, Y2, . . . , Yn to a predetermined precharge voltage. If the voltage polarities of the source line driving signals Y1, Y2, . . . , Yn applied to neighboring source lines SL are opposite to each other, the precharge voltage may be VDD/2. For example, if a voltage of a first source line driving signal Y1 has a positive polarity voltage between VDD and VDD/2 and a voltage of a second source line driving signal Y2 has a negative polarity voltage between VDD/2 and VSS (e.g., a ground voltage), the precharge voltage may be VDD/2.

The charge sharing switches 240 control the voltages of each of the source line driving signals Y1, Y2, . . . , Yn to be VDD/2 during a charge sharing period before the output switches 230 are turned on. In other words, the voltage of each of the source line driving signals Y1, Y2, . . . , Yn is precharged to VDD/2, and the output switches 230 are turned on to supply the driving signals amplified by the output buffers 220 to their corresponding loads LD.

FIG. 3 is a circuit diagram of the conventional output buffer 220 shown in FIG. 2. Referring to FIG. 3, the output buffer 220 is implemented by a rail-to-rail operational amplifier.

The output buffer 220 includes an input section 221, an amplifier section 223, a capacitor section 225, and an output section 227. Here, the output buffer 220 has a voltage follower configuration in which an output signal OUT is fed back as a second input signal INN. A first input signal INP is an analog image signal and the second input signal INN is a source line driving signal.

The input section 221 includes first through third PMOS transistors MP1 through MP3 and first through third NMOS transistors MN1 through MN3, and receives the first input signal INP and the second input signal INN, which are complementary signals. A first bias voltage VB1 is applied to the gate of the first PMOS transistor MP1 and a sixth bias voltage VB6 is applied to the gate of the third NMOS transistor MN3.

The amplifier section 223, which is a folded cascode section, includes fourth through ninth PMOS transistors MP4 through MP9, and fourth through ninth NMOS transistors MN4 through MN9, and receives output signals of the input section 221 to amplify the input signals INP and INN. A second bias voltage VB2 is applied to the gates of the sixth and seventh PMOS transistors MP6 and MP7 and a third bias voltage VB3 is applied to the gates of the eighth and ninth PMOS transistors MP8 and MP9. A fourth bias voltage VB4 is applied to the gates of the fourth and fifth NMOS transistors MN4 and MN5 and a fifth bias voltage VB5 is applied to the gates of the sixth and seventh NMOS transistors MN6 and MN7.

The capacitor section 225 includes two capacitors Cp and stabilizes the frequency characteristics of the output signal OUT. The capacitor section 225 controls the output signal OUT of the output buffer 220 so that is does not oscillate. The capacitor section 225 is also called a 'Miller compensation capacitor'.

The output section 227 includes a PMOS transistor MP10 and an NMOS transistor MN10, receives output signals of the amplifier section 223 and generates the output signal OUT of the output buffer 220. The output signal OUT is a source line driving signal.

A slew rate SR of the output voltage of the conventional output buffer 220 can be calculated using Equation 1 shown below.

$$SR=dV_{out}/dt=(IMP1+IMN3)/2C, \quad (1)$$

where, $V_{out}$ is the output voltage of the output buffer 220, IMP1 is an amount of current flowing through the first PMOS transistor MP1, IMN3 is an amount of current flowing through the third NMOS transistor MN3, and C is the total capacitance of the capacitor Cp included in the capacitor section 225.

Since the conventional output buffer 220 has the constant capacitance C, the slew rate SR of the output voltage cannot be easily enhanced. For this reason, a source driver using the conventional output buffer 220 is unsuitable for a large-sized liquid crystal panel having source lines with large loads. Accordingly, there is a need for an output buffer for use with a source driver in an LCD that is capable of obtaining an enhanced slew rate.

SUMMARY OF THE INVENTION

According to an aspect of the present invention, there is provided an output buffer for a source driver of an LCD, comprising: an amplifier section amplifying an analog image signal; an output section outputting a source line driving signal for driving a source line of the LCD in response to a signal amplified by the amplifier section; and a slew rate controller section, setting a capacitance of a capacitor section to a first capacitance, during a first charge sharing period in which the source line is precharged to a first precharge voltage, setting the capacitance of the capacitor section to a second capacitance smaller than the first capacitance during a second charge sharing period in which the source line driving signal is supplied to the source line, and setting the capacitance of the capacitor section to the first capacitance while the source line driving signal is maintained after the second charge sharing period.

The first charge sharing period has the same length as the second charge sharing period. The first precharge voltage is half a power supply voltage. The second capacitance is zero.

The output buffer further comprises an input section for receiving the analog image signal and the source line driving signal. The output buffer is implemented by a rail-to-rail operational amplifier or by two operational amplifiers.

The first capacitance is set by activating first and second slew rate control signals and the second capacitance is set by deactivating the first and second slew rate control signals, and the first slew rate control signal is a signal obtained by delaying a sharing switch control signal for controlling the source line to be precharged to the precharge voltage and the second slew rate control signal is an inverted signal of the first slew rate control signal. The first slew rate control signal may also be a signal obtained by delaying the sharing switch control signal by the first charge sharing period through a D flip flop.

The slew rate controller section further comprises first and second switches for controlling the capacitance of the capacitor section to switch between the first capacitance and the second capacitance, in response to the first and second slew rate control signals. The first switch is a PMOS transistor and the second switch is an NMOS transistor.

According to another aspect of the present invention, there is provided an output buffer for a source driver of an LCD, comprising: an amplifier section amplifying an analog image signal and including a first current mirror circuit and a second current mirror circuit; an output section outputting a source line driving signal for driving a source line of the LCD through an output node in response to a signal amplified by the amplifier section; and a slew rate controller section, wherein the slew rate controller section comprises: a first capacitor connected between the output node of the output section and an output node of a first current mirror circuit; a second capacitor connected in parallel with the first capacitor and disconnected from the first capacitor when the source line driving signal supplied to the source line is initially activated; a third capacitor connected between the output node of the output section and an output node of the second current minor circuit; and a fourth capacitor connected in parallel with the third capacitor and disconnected from the third capacitor when the source line driving signal supplied to the source line is initially activated.

The first and third capacitors have the same capacitance, and the second and fourth capacitors have the same capacitance. The capacitances of the first and third capacitors are zero.

According to another aspect of the present invention, there is provided a method for controlling an output buffer in a source driver of an LCD, comprising: setting the capacitance of a capacitor section in the output buffer to a first capacitance, during a first charge sharing period, in which the source line is precharged to a first precharge voltage; setting the capacitance of the capacitor section to a second capacitance smaller than the first capacitance, during a second charge sharing period, in which the source line driving signal supplied to the source line is initially activated; and setting the capacitance of the capacitor section to the first capacitance while the source line driving signal is maintained after the second charge sharing period.

BRIEF DESCRIPTION OF THE DRAWINGS

The above and other features of the present invention will become more apparent by describing in detail exemplary embodiments thereof with reference to the attached drawings in which:

FIG. 6 is a table showing simulation results obtained by using an output buffer according to an exemplary embodiment of the present invention in a source driver of an LCD and a conventional output buffer in a source driver of an LCD.

DETAILED DESCRIPTION OF EXEMPLARY EMBODIMENTS

Hereinafter, embodiments of the present invention will be described in detail with reference to the appended drawings. Like reference numbers refer to like components throughout the drawings.

Figure 4:
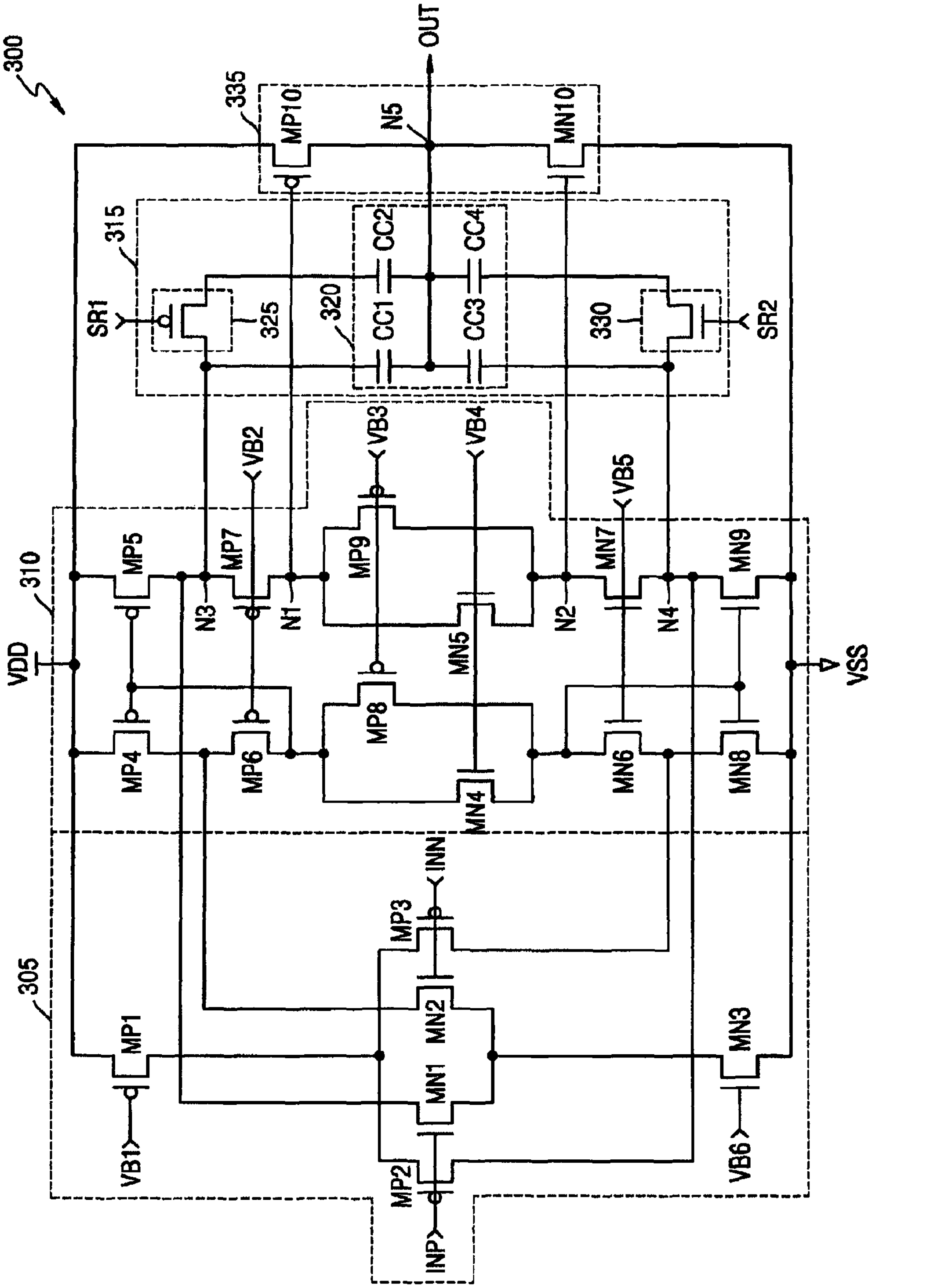
FIG. 4 is a circuit diagram of an output buffer according to an exemplary embodiment of the present invention.

FIG. 4 is a circuit diagram of an output buffer 300 according to an embodiment of the present invention. Referring to FIG. 4, the output buffer 300, which is implemented by a rail-to-rail operational amplifier, may be used in place of the output buffer 220 in the source driver 200 shown in FIG. 2.

The output buffer 300 includes an input section 305, an amplifier section 310, a slew rate controller section 315, and an output section 335. The output buffer 300 has a voltage follower configuration in which an output signal OUT is fed back as a second input signal INN. A first input signal INP is an analog image signal and the second input signal INN is a source line driving signal.

The input section 305 includes first through third PMOS transistors MP1 through MP3 and first through third NMOS transistors MN1 through MN3, and receives the first and second input signals INP and INN, which are complementary signals. A first bias voltage VB1 is applied to the gate of the first PMOS transistor MP1, and a sixth bias voltage VB6 is applied to the gate of the third NMOS transistor MN3.

The amplifier section 310, which is a folded cascode section, includes fourth through ninth PMOS transistors MP4 through MP9 and fourth through ninth NMOS transistors MN4 through MN9, and receives output signals of the input section 305 to amplify the input signals INP and INN.

A second bias voltage VB2 is applied to the gates of the sixth and seventh PMOS transistors MP6 and MP7, and a third bias voltage VB3 is applied to the gates of the eighth and ninth PMOS transistors MP8 and MP9. A fourth bias voltage VB4 is applied to the gates of the fourth and fifth NMOS transistors MN4 and MN5, and a fifth bias voltage VB5 is applied to the gates of the sixth and seventh NMOS transistors MN6 and MN7.

The fourth through seventh PMOS transistors MP4 through MP7 constitute a first current mirror circuit and the sixth through ninth NMOS transistors MN6 through MN9 constitute a second current mirror circuit. The eighth and ninth PMOS transistors MP8 and MP9 and the fourth and fifth NMOS transistors MN4 and MN5 control the amount of current flowing through a tenth PMOS transistor MP10 of the output section 335 and/or the amount of current flowing through a tenth NMOS transistor MN10 of the output section 335.

The output section 335 includes the PMOS transistor MP10 and the NMOS transistor MN10, and receives signals via output nodes N1 and N2 of the amplifier section 310 to generate the output signal OUT of the output buffer 300 through an output node N5. The output signal OUT is a source line driving signal for driving one of the source lines SL shown in FIG. 2.

The slew rate controller section 315 includes a capacitor section 320 such as a Miller compensation capacitor, a first switch 325, and a second switch 330. The capacitor section 320 includes first through fourth capacitors CC1, CC2, CC3, and CC4. The first capacitor CC1 is connected between an output node N3 of the first current mirror circuit in the amplifier section 310 and the output node N5 of the output section 335. The second capacitor CC2 is disconnected from the first capacitor CC1 when a source line driving signal applied to the source lines SL is initially activated. The third capacitor CC3 is connected between an output node N4 of the second current mirror circuit in the amplifier section 310 and the output node N5 of the output section 335. The fourth capacitor CC4 is disconnected from the third capacitor CC3 when a source line driving signal applied to the source lines SL is initially activated.

Figure 3:
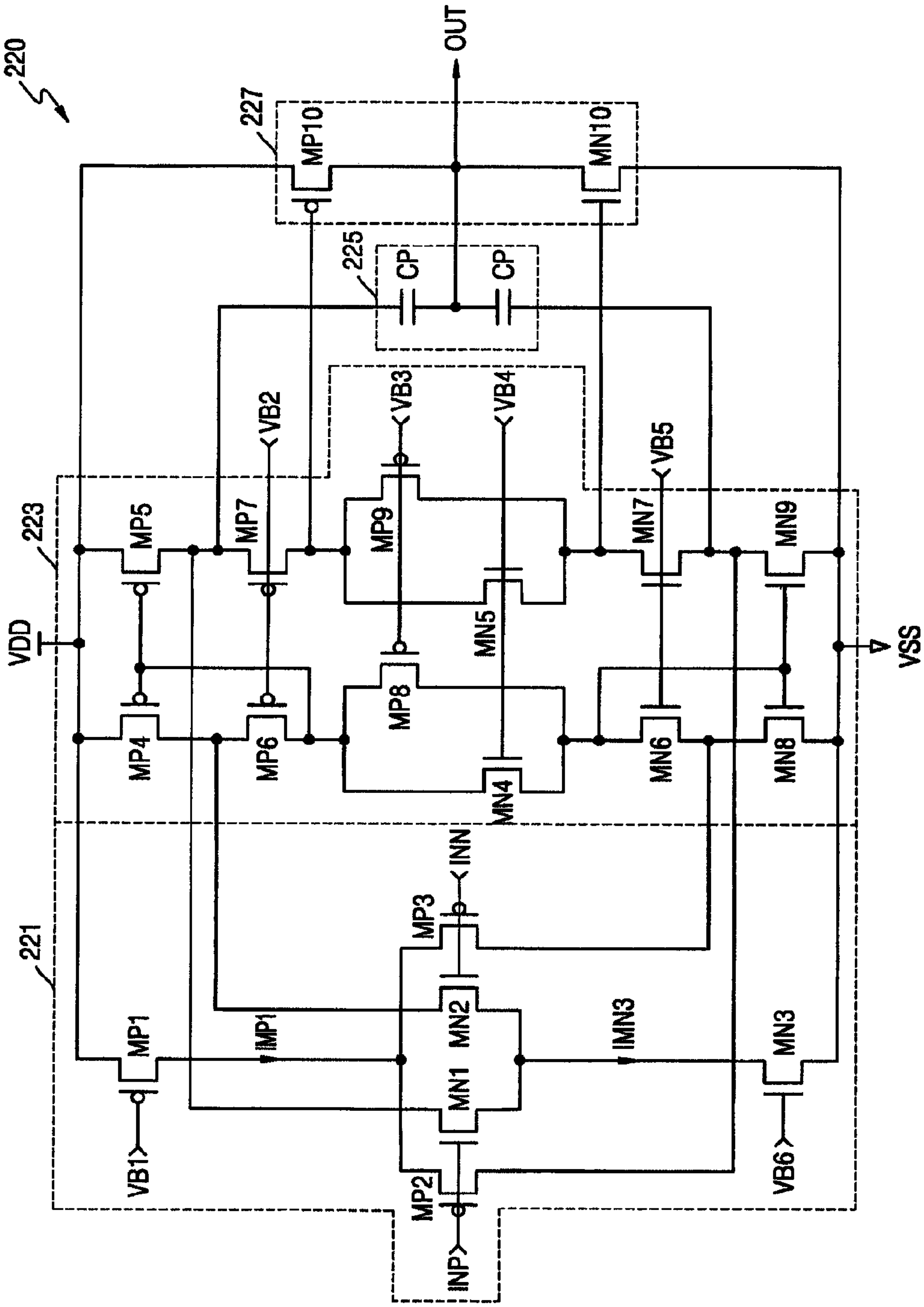
FIG. 3 (PRIOR ART)
FIG. 3 is a circuit diagram of a conventional output buffer shown in FIG. 2.

Preferably, the capacitances of the first and third capacitors CC1 and CC3 are equal and the capacitances of the second and fourth capacitors CC2 and CC4 are equal. Each of the first and third capacitors CC1 and CC3 has a minimum capacitance of zero. In addition, the parallel capacitance of the first capacitor CC1 and the second capacitor CC2 should be equal to the capacitance of one of the capacitors Cp shown in FIG. 3.

As further shown in FIG. 4, the first switch 325 may be a PMOS transistor and the second switch 330 may be an NMOS transistor. The first switch 325 connects/disconnects the first capacitor CC1 to/from the second capacitor CC2 in response to a first slew rate control signal SR1. The second switch 330 connects/disconnects the third capacitor CC3 to/from the fourth capacitor CC4 in response to a second slew rate control signal SR2.

Figure 1:
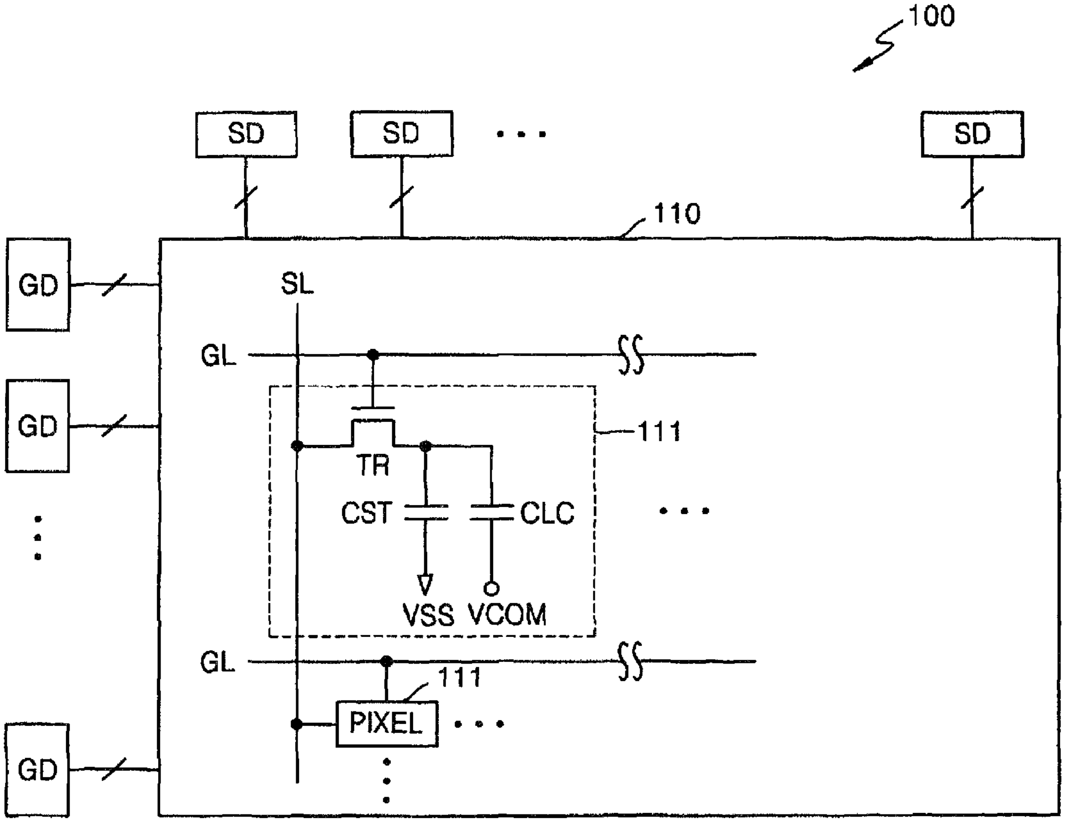
FIG. 1 (PRIOR ART)
FIG. 1 is a block diagram illustrating a conventional LCD.
Figure 2:
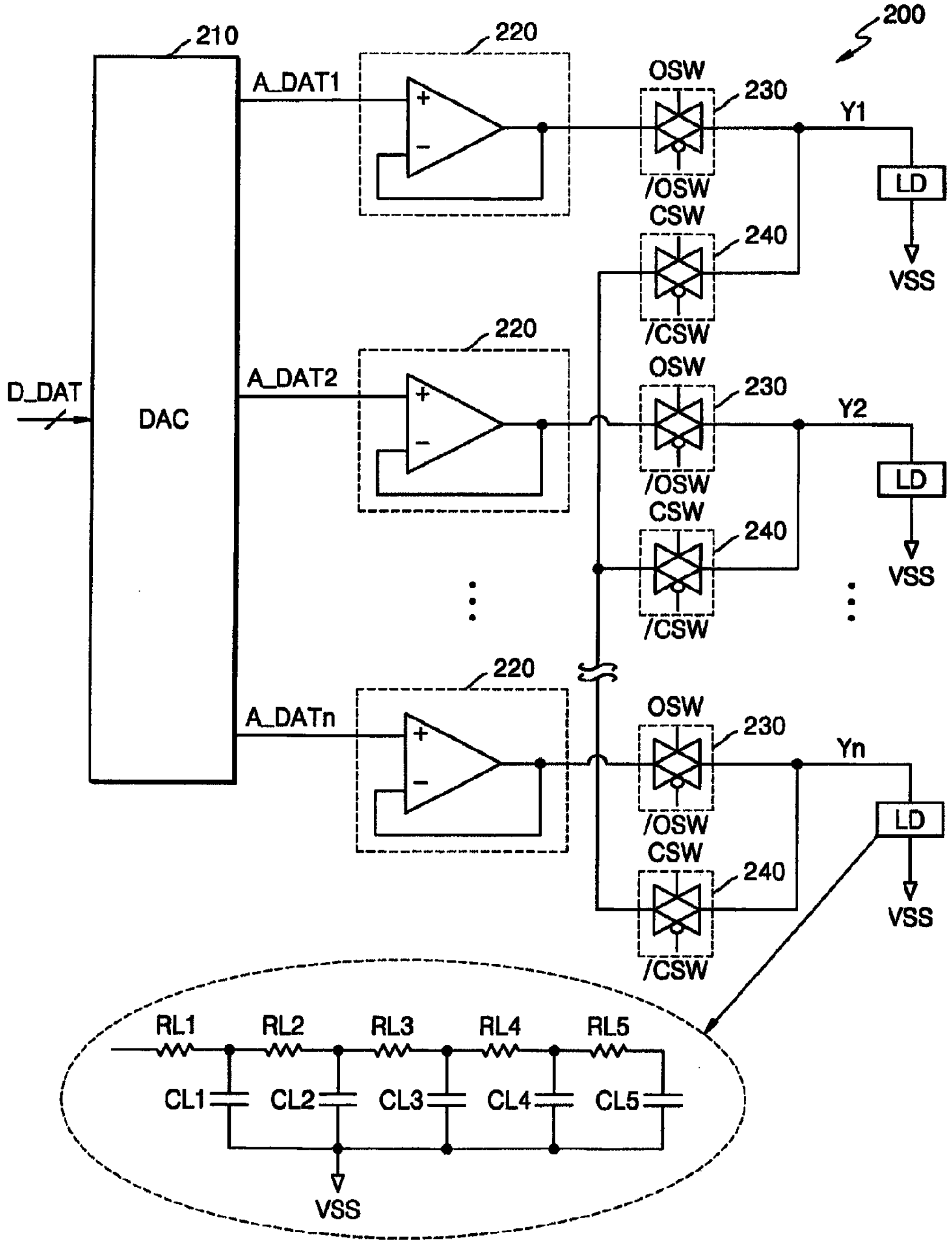
FIG. 2 (PRIOR ART)
FIG. 2 is a circuit diagram of a source driver shown in FIG. 1.
Figure 7:
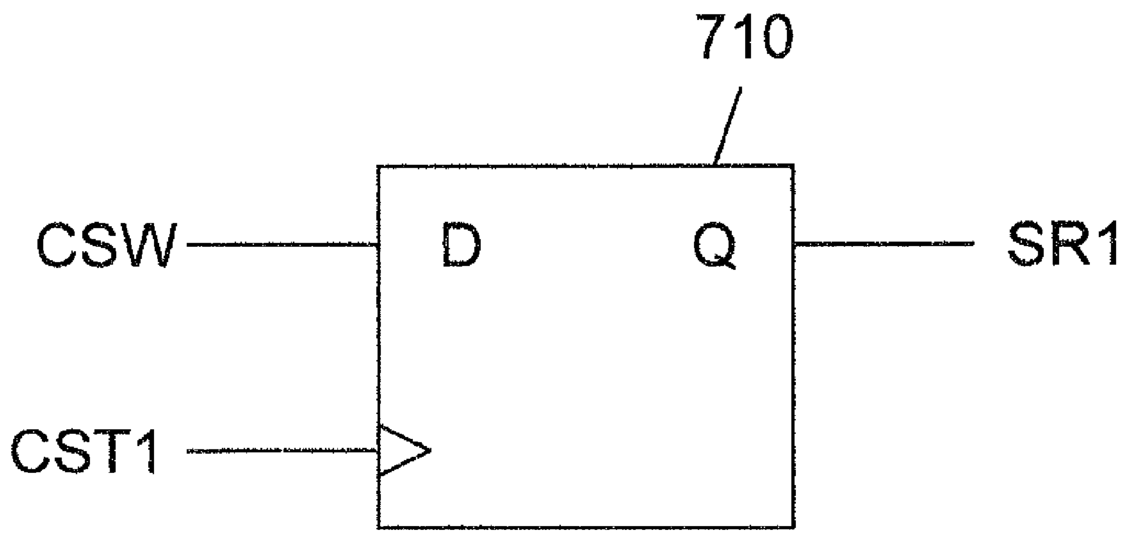
FIG. 7 is a circuit diagram showing a slew rate control signal according to an exemplary embodiment of the present invention.

The first slew rate control signal SR1 is a delayed signal of a sharing switch control signal such as CSW of FIG. 2 for controlling the source lines SL to be precharged to a predetermined precharge voltage. The second slew rate control signal SR2 is an inverted signal of the first slew rate control signal SR1. The precharge voltage is half the value of a power supply voltage (e.g., VDD/2). As shown in FIG. 7, the first slew rate control signal SR1 may also be a signal obtained from delaying the sharing switch control signal CSW by a first charge sharing period CST1 during which the source lines SL are precharged to the precharge voltage through a D flip-flop 710.

The slew rate controller section 315 sets the capacitance of the capacitor section 320 to a first capacitance (e.g., a capacitance formed by the parallel connections between the capacitors CC1 and CC2 and between the capacitors CC3 and CC4) to stabilize the frequency characteristics of the source line driving signal, during the first charge sharing period. The slew rate controller section 315 sets the capacitance of the capacitor section 320 to a second capacitance (e.g., the capacitance formed by the capacitors CC1 and CC3 connected in series) smaller than the first capacitance, during a second charge sharing period following the first charge sharing period, in which a source line driving signal applied to the source lines SL is initially activated.

The slew rate controller section 315 sets the capacitance of the capacitor section 320 to the first capacitance while the source line driving signal is continuously supplied after the second charge sharing period. The first capacitance is set by activating the first and second slew rate control signals SR1 and SR2. The second capacitance is set by deactivating the first and second slew rate control signals SR1 and SR2. The first charge sharing period may be set to be equal to the second charge sharing period.

In summary, the slew rate controller section 315 controls the capacitance of the capacitor section 320 to switch between the first capacitance and the second capacitance, in response to the first and second slew rate control signals SR1 and SR2. Accordingly, the slew rate controller section 315 stabilizes the frequency characteristics of the source line driving signal OUT and enhances a slew rate of the voltage of the source line driving signal OUT. Therefore, the output buffer 300 according to an embodiment of the present invention can output a source line driving signal OUT with a high slew rate by adjusting the capacitance of the capacitor section 320 as expressed by Equation 1.

It is to be understood by one of ordinary skill in the art that although the output buffer 300 according to an embodiment of the present invention has been described as being implemented by a rail-to-rail operational amplifier, the output buffer 300 can be implemented by two operational amplifiers each having an input section with a structure different from the input section of the rail-to-rail operational amplifier.

Figure 5:
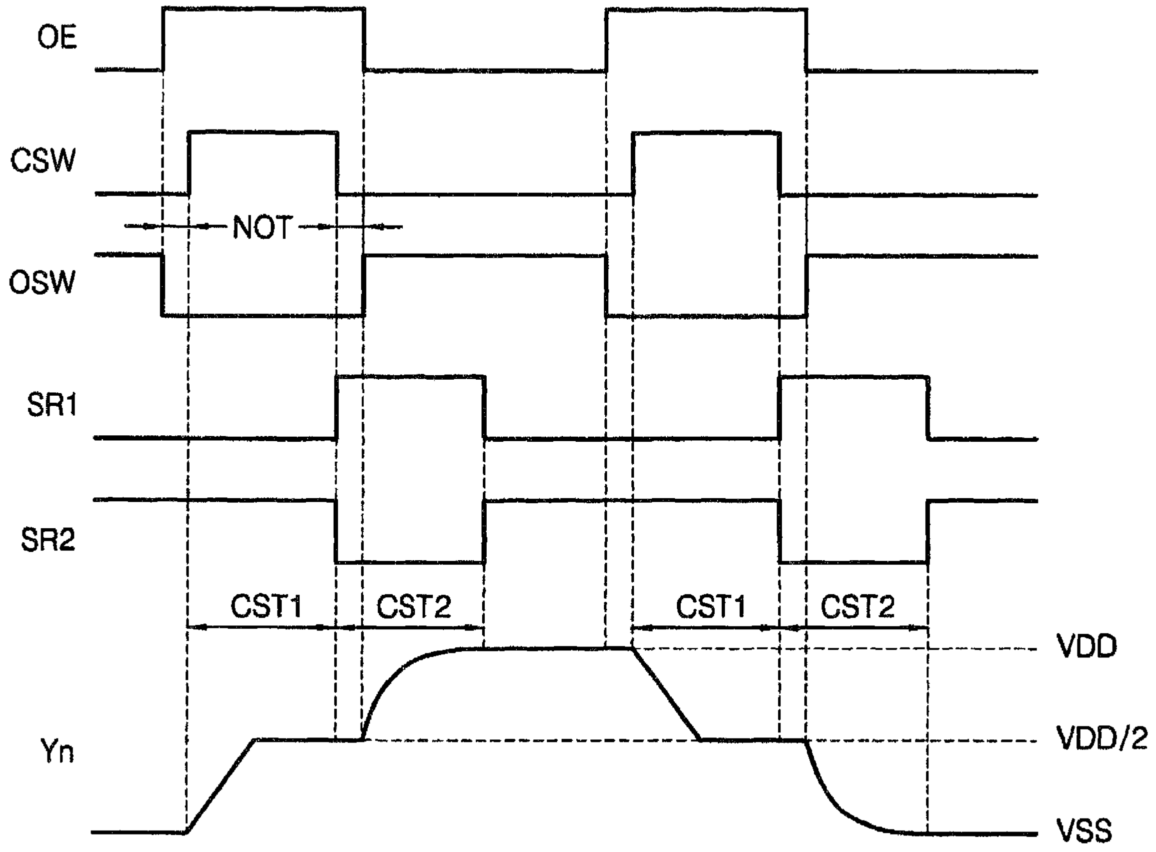
FIG. 5 is a timing diagram for explaining an operation of the source driver shown in FIG. 2 when the output buffer shown in FIG. 4 is used as an output buffer of the source driver.

FIG. 5 is a timing diagram for explaining the operation of the source driver 200 shown in FIG. 2 when the output buffer 300 shown in FIG. 4 is used as an output buffer of the source driver 200.

Referring to FIG. 5, a sharing switch control signal CSW and an output switch control signal OSW are generated in response to an output enable signal OE. The output enable signal OE is generated from a timing controller for controlling the source driver 200.

While the sharing switch control signal CSW is high (e.g., in an activation state), during the first charge sharing period CST1, a source line driving signal Yn (n is a natural number) rises from a ground voltage VSS to a precharge voltage VDD/2. The first charge sharing period CST1 may be, for example, 0.5 μs through 1.0 μs. During the first charge sharing period CST1, the first slew rate control signal SR1 is activated to a low level and the second slew rate control signal SR2 is activated to a high level. Accordingly, the capacitance of the capacitor section 320 illustrated in FIG. 4 is set to the first capacitance (e.g., the capacitance formed by the parallel connections between the capacitors CC1 and CC2 and between the capacitors CC3 and CC4).

During the second charge sharing period CST2, which has the same length as the first charge sharing period CST1, and follows the first charge sharing period CST1, since the output switch control signal OSW remains high after a non-overlapping time NOT, a positive polarity voltage (e.g., a power supply voltage VDD) of the source line driving signal Yn begins to be supplied to the source line. The non-overlapping time NOT is used to prevent excessive current from flowing through the source lines SL. The non-overlapping time NOT may be 5 ns.

Also during the second charge sharing period CST2, the first slew rate control signal SR1 is deactivated to a high level and the second slew rate control signal SR2 is deactivated to a low level. Accordingly, the capacitance of a capacitor section such as the capacitor section 320 of FIG. 4 is set to the second capacitance (e.g., the capacitance of the capacitors CC1 and CC3). As a result, the source line driving signal Yn rises sharply toward VDD. In other words, during the second charge sharing period CST2, a high slew rate is obtained.

After the second charge sharing period CST2, the first slew rate control signal SR1 is again activated to a low level and the second slew rate control signal SR2 is activated to a high level, so that the capacitance of the capacitor section 320 of FIG. 4 is set to the first capacitance. As a result, the frequency characteristics of the source line driving signal Yn are stabilized. At this time, since the output switch control signal OSW remains high, the source line driving signal Yn has the voltage VDD.

When the voltage of the source line driving signal Yn has a negative polarity (e.g., VSS), its frequency characteristics are stabilized in the same fashion as described above for when the source line driving signal Yn has a positive polarity voltage (e.g., VDD).

FIG. 6 is a table showing simulation results obtained by using an output buffer according to an embodiment of the present invention in a source driver of an LCD and a conventional output buffer in a source driver of an LCD.

The table of FIG. 6 lists a settling time and operation currents IDD flowing through a source line of the source drivers, when a power supply voltage VDD is 13.5 V. The settling time is divided into a rising period and a falling period. In addition, the rising period is divided into a first rising period Tr1 and a second rising period Tr2, and the falling period is divided into a first falling period Tf1 and a second falling period Tf2.

The first rising period Tr1 is a period during which the source line driving signal Yn rises from 10% of a target voltage to 90% of the target voltage. The second rising period Tr2 is a period during which the source line driving signal Yn rises from 10% of the target voltage to 99.5% of the target voltage. The first falling period Tf1 is a period during which the source line driving signal Yn falls from 90% of the target voltage to 10% of the target voltage. The second falling period Tf2 is a period during which the source line driving signal Yn falls from 99.5% of the target voltage to 10% of the target voltage.

Referring to the table of FIG. 6, according to an embodiment of the output buffer of the present invention, the rising and falling periods of a source line driving signal can be reduced, thereby enhancing a slew rate of the source line driving signal. In addition, a current flowing through a channel (or, e.g., a source line or a data line), can be reduced.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An output buffer for a source driver of an LCD, comprising:

an amplifier section amplifying an analog image signal and including a first current mirror circuit and a second current mirror circuit;

an output section outputting a source line driving signal for driving a source line of the LCD through an output node in response to a signal amplified by the amplifier section; and a slew rate controller section, wherein the slew rate controller section comprises:

a first capacitor connected between the output node of the output section and an output node of a first current mirror circuit;

a second capacitor connected in parallel with the first capacitor and disconnected from the first capacitor when the source line driving signal supplied to the source line is initially activated;

a third capacitor connected between the output node of the output section and an output node of the second current mirror circuit; and a fourth capacitor connected in parallel with the third capacitor and disconnected from the third capacitor when the source line driving signal supplied to the source line is initially activated.

2. The output buffer of claim 1, wherein the slew rate controller section further comprises:

a first switch connecting the first capacitor to the second capacitor in response to a first slew rate control signal or disconnecting the first capacitor from the second capacitor in response to the first slew rate control signal; and a second switch connecting the third capacitor to the fourth capacitor in response to a second slew rate control signal or disconnecting the third capacitor from the fourth capacitor in response to the second slew rate control signal.

3. The output buffer of claim 2, wherein the first switch is a PMOS transistor and the second switch is an NMOS transistor.

4. The output buffer of claim 1, wherein the first and third capacitors have the same capacitance, and the second and fourth capacitors have the same capacitance.

5. The output buffer of claim 1, wherein the first or third capacitor has a minimum capacitance of zero.

6. The output buffer of claim 2, further comprising:

an input section for receiving the analog image signal and the source line driving signal.

7. The output buffer of claim 6, wherein the output buffer is implemented by a rail-to-rail operational amplifier or by two operational amplifiers.

8. The output buffer of claim 2, wherein the first slew rate control signal is a signal obtained by delaying a sharing switch control signal to control the source line being precharged to a first precharge voltage or the first slew rate control signal is a signal obtained by delaying the sharing switch control signal by a charge sharing period during which the source line is precharged to the first precharge voltage through a D flip flop, and the second slew rate control signal is an inverted signal of the first slew rate control signal.

9. The output buffer of claim 1, wherein the first precharge voltage is half a power supply voltage.

* * * * *